United States Patent
Shiobara et al.

[11] Patent Number: 6,083,774
[45] Date of Patent: Jul. 4, 2000

[54] METHOD OF FABRICATING A FLIP CHIP MOLD INJECTED PACKAGE

[75] Inventors: Toshio Shiobara; Kazuhiro Arai, both of Gunma-ken, Japan

[73] Assignee: Shin-Etsu Chemical Co., Ltd., Tokyo, Japan

[21] Appl. No.: 09/240,575

[22] Filed: Feb. 1, 1999

[30] Foreign Application Priority Data

Feb. 2, 1998 [JP] Japan .................................. 10-035453

[51] Int. Cl.$^7$ .................................................. H01L 21/44
[52] U.S. Cl. ........................... 438/108; 438/127; 156/382
[58] Field of Search ................... 438/108, 127; 156/335, 382

[56] References Cited

U.S. PATENT DOCUMENTS

| | | | |
|---|---|---|---|
| 4,999,699 | 3/1991 | Christie | 357/65 |
| 5,089,440 | 2/1992 | Christie | 437/209 |
| 5,292,688 | 3/1994 | Hsiao | 437/209 |
| 5,912,320 | 6/1999 | Hotta | 528/373 |
| 5,928,595 | 7/1999 | Knapp | 264/272.17 |

*Primary Examiner*—Charles Bowers
*Assistant Examiner*—Nema Berezny
*Attorney, Agent, or Firm*—Birch, Stewart, Kolasch & Birch, LLP

[57] ABSTRACT

When a semiconductor chip is mounted on a circuit substrate, the space therebetween can be briefly sealed with a resin encapsulant by transfer molding an encapsulating resin composition in molten state and under pressure into the space and heat curing the composition thereat. The composition contains (a) an epoxy resin, (b) a curing agent, and (c) an inorganic filler having a maximum particle size of up to 24 $\mu$m and has a melt viscosity of up to 200 poises at the molding temperature. Then encapsulation can be completed within a very short cycle without allowing the filler to settle. Semiconductor devices are manufactured to high reliability.

10 Claims, 2 Drawing Sheets

METHOD OF FABRICATING A FLIP CHIP MOLD INJECTED PACKAGE

This invention relates to a method for fabricating semiconductor devices of the flip chip design.

BACKGROUND OF THE INVENTION

For the fabrication of current advanced semiconductor sevices, because of an increased number of I/O pins for improved performance and a reduction in package size, the conventional system of connecting semiconductor chips to lead frames using gold wires is employed less frequently. Under the circumstances, the flip chip system of mounting semiconductor chips to substrates or boards via solder is more frequently employed in the recent years. In the connecting method of this type, the reliability of semiconductor chips is improved by infiltrating a liquid epoxy resin into the space between semiconductor chips and substrates and curing the resin therein. Since the space between semiconductor chips and substrates is filled with the resin by capillary action, the filling step requires a very long time. If the viscosity of the resin composition is reduced in order to shorten the fill time, the inorganic filler in the encapsulating resin composition can settle during heat curing, resulting in a difference in expansion coefficient between upper and lower portions of the cured resin. This detracts from the reliability of semiconductor devices.

SUMMARY OF THE INVENTION

An object of the invention is to provide a novel and improved method for fabricating a semiconductor device of the flip chip design, which ensures that the space between a substrate and a semiconductor chip is filled with a resin encapsulant without generating voids and without damaging solder bumps, and encapsulation is completed within a short time, whereby the resulting semiconductor device has improved moisture resistance and reliability.

We have found that the space between a semiconductor chip and a substrate can be briefly sealed with a resin encapsulant by transfer molding, more particularly by introducing a specific encapsulating resin composition in molten state and under pressure into the space between the chip and the substrate and heat curing the resin thereat. Then encapsulation can be completed within a very short cycle without allowing the filler to settle. Semiconductor devices are manufactured to high reliability.

The present invention provides a method for fabricating (or manufacturing) a semiconductor device, comprising the steps of placing a semiconductor chip having contacts over a circuit substrate having interconnecting electrodes such that the semiconductor chip contacts abut against the substrate electrodes via solder bumps; heating and fusing the solder bumps to join the semiconductor chip to the substrate; placing the substrate having the semiconductor chip mounted thereon in a cavity of a mold; feeding an encapsulating resin composition in molten state and under pressure into the mold cavity through a gate for forcibly filling the space between said substrate and said semiconductor chip with the resin composition; and curing the resin composition for encapsulating the space with the resin composition. The encapsulating resin composition comprises (a) an epoxy resin, (b) a curing agent, and (c) a particulate inorganic filler having a maximum particle size of up to 24 μm as essential components. The content of filler (c) is 50 to 85% by weight based on the entire composition. The composition has a melt viscosity of up to 200 poises at the molding temperature.

DESCRIPTION OF THE PREFERRED EMBODIMENTS

Figure 1:
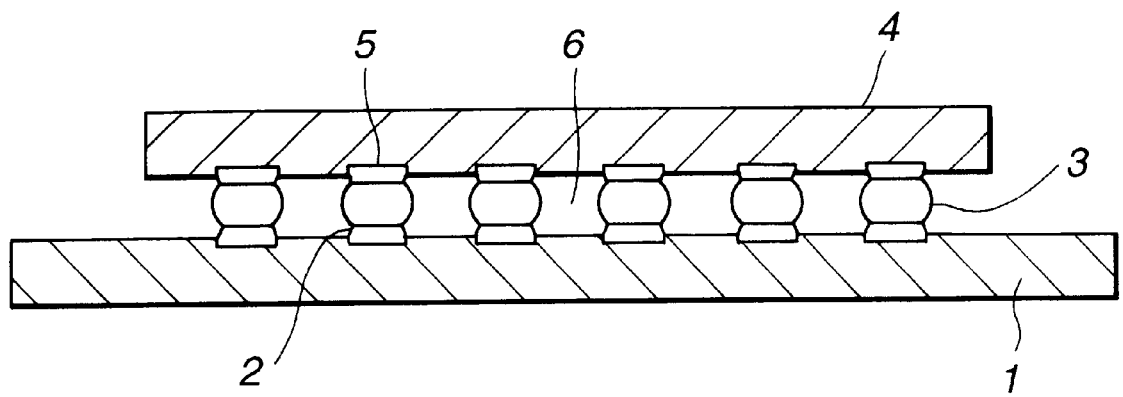
FIG. 1 is a schematic cross-sectional view of an assembly of a semiconductor chip and a substrate.
Figure 2:
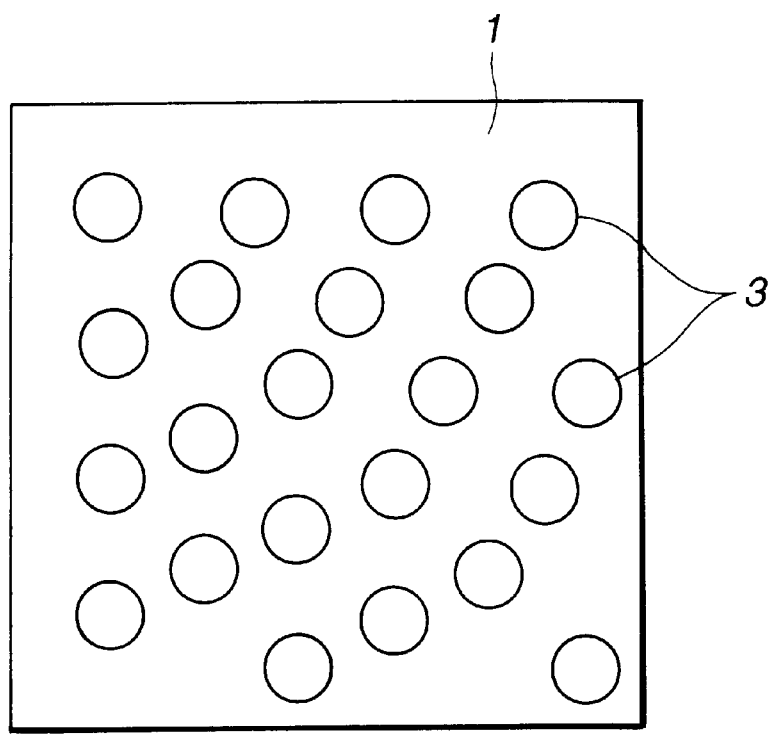
FIG. 2 is a plan view showing an exemplary arrangement of solder bumps.

Referring to FIGS. 1 to 4, the method for fabricating a semiconductor device according to the invention is illustrated. As shown in FIG. 1, a substrate 1 has a wiring circuit formed on one surface thereof, which is depicted as interconnecting electrodes 2. A semiconductor chip 4 having contacts 5 is placed over the substrate 1 such that the semiconductor chip contacts 5 abut against the substrate electrodes 2 via solder bumps 3. The solder bumps 3 are then heated and fused to join the semiconductor chip 4 to the substrate 1. Typically, the distance between the semiconductor chip and the substrate is about 10 μm to about 150 μm, and desirably about 20 μm to about 100 μm. As the number of contacts increases, the size of solder bumps is reduced and the chip-to-substrate distance naturally becomes shorter. When the inventive method is applied, the chip-to-substrate distance is desirably 30 μm or more. The solder bumps 3 are distributed in a pattern as shown in FIG. 2.

The substrate having the semiconductor chip mounted thereon is then set in a cavity of a mold. An encapsulating resin composition in molten state and under pressure is introduced into the mold cavity through a gate of the mold for forcibly filling the space between the substrate and the semiconductor chip with the resin composition, and cured thereat. This is a so-called transfer molding process. In this way, the space between the substrate and the semiconductor chip is encapsulated with the resin composition.

Figure 3:
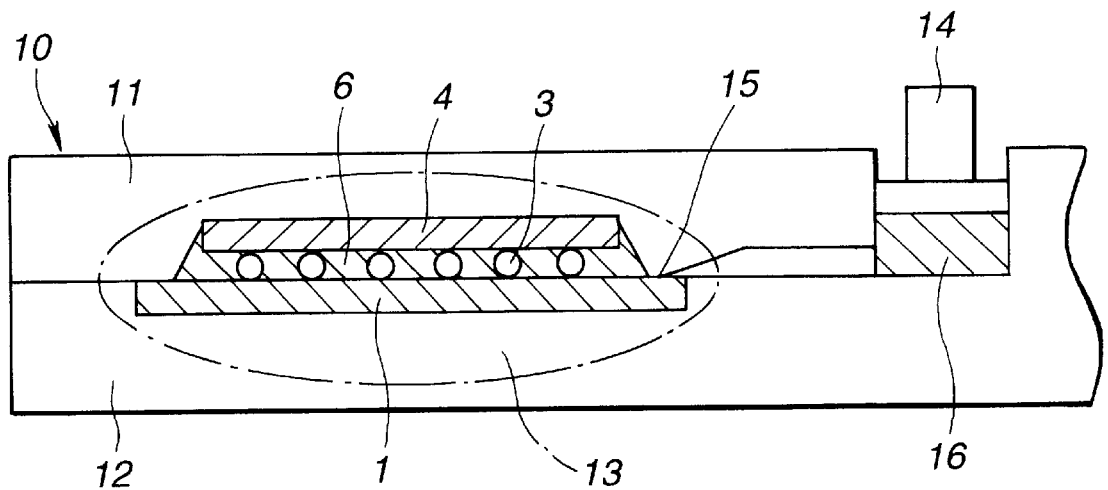
FIG. 3 is a schematic cross-sectional view of a mold in which the substrate having the semiconductor chip mounted thereon is encapsulated with resin.

As shown in FIG. 3, a mold 10 includes an upper mold section 11 and a lower mold section 12 defining a cavity 13 which are removably mated. The substrate 1 having the semiconductor chip 4 mounted thereon is set in the cavity 13 of the lower mold section 12 whereupon the upper mold section 11 is moved back to close the cavity 13. The mold is heated at a suitable temperature, preferably about 130 to about 200° C. If the mold temperature is below 130° C., the encapsulating resin composition would have a higher melt viscosity so that the resin can sweep away solder bumps during molding or allow voids to be left in the interior. If the mold temperature is above 200° C., rapid reaction can result in short-filling. Thereafter, the encapsulating resin composition 16 is admitted in a plunger pot and compressed under a plunger 14. Before admitting into the plunger pot, the encapsulating resin composition may have a cylindrical preform or be in granular form. For effective molding, it is preferred to preheat the encapsulating resin composition at 50 to 100° C. by a high-frequency preheater prior to admission into the plunger pot. The molding pressure is usually 10 to 100 kgf/cm², desirably 30 to 50 kgf/cm². A pressure below 10 kgf/cm² would be too low to achieve full filling whereas a pressure above 100 kgf/cm² would carry away the solder. It is preferred from the reliability standpoint to set the pressure as high as possible within the range causing no troubles.

Figure 4:
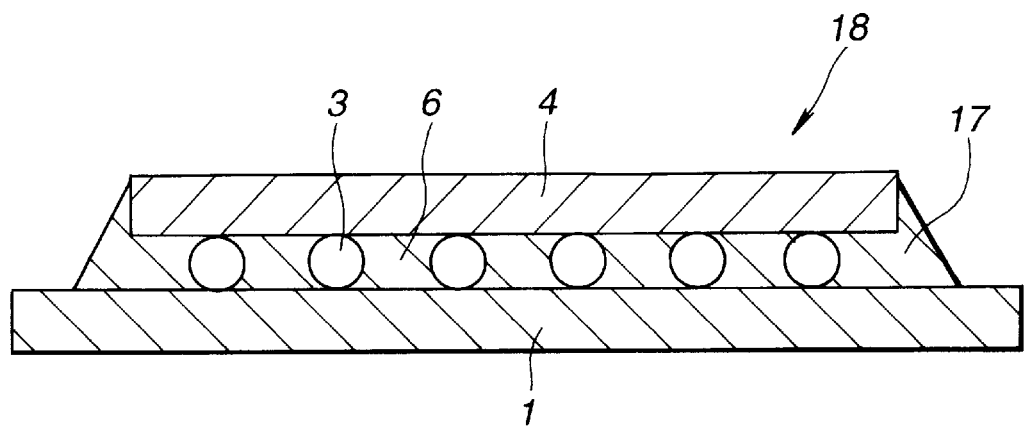
FIG. 4 is a schematic cross-sectional view of a semiconductor device according to one embodiment of the invention.

The molten resin composition 16 is introduced under pressure into the cavity 13 through a gate 15 of the mold 10 for forcibly filling the space 6 between the substrate 1 and the semiconductor chip 4 with the resin composition. The resin composition is cured in the space 6, yielding a semiconductor device 18 having the space 6 sealed with the resin 17 as shown in FIG. 4. The curing time is usually 60 to 240 seconds, desirably 60 to 120 seconds. As the transfer molding technique, it is recommended to use a molding apparatus using a film known as the pre-packaged-process (abbreviated as 3P system) because the leakage of resin through the mating joint between the upper and lower mold sections can be prevented. The 3P system is also advantageous in that since the resin does not come in direct contact with the mold, the use of the encapsulating resin composition free of a mold release agent does not encounter a parting problem, and even a liquid encapsulating resin composition can be used.

The encapsulating resin composition used herein is a curable epoxy resin composition comprising (a) an epoxy resin, (b) a curing agent, and (c) an inorganic filler as essential components. Since semiconductor chips typically dimensioned 5 to 20 mm by 5 to 20 mm by 0.1 to 0.6 mm thick and presenting a space of 10 to 150 μm must be encapsulated, the resin composition used herein should have different flow properties and cure properties than the conventional well-known semiconductor device-encapsulating resin compositions. In particular, the viscosity of the composition during molding is crucial. Specifically, the composition should have a melt viscosity of up to 200 poises at the molding temperature. For molding at 130 to 200° C., preferably 150 to 185° C., more preferably 175° C., for example, the composition has a melt viscosity of up to 200 poises, desirably 5 to 100 poises, more desirably 10 to 50 poises, as measured at the molding temperature. Since it is desirable to finish the resin injection within about 3 to 30 seconds, the resin composition should desirably have a gel time of at least 20 seconds, more desirably at least 30 seconds, most desirably at least 35 seconds, at the molding temperature. As a measure of fluidity, the resin composition should desirably have a spiral flow of about 100 to 250 cm, more desirably about 150 to 250 cm as measured at 175° C. and 70 kgf/cm$^2$.

The respective components of the encapsulating resin composition are described below. Component (a) is any of conventional well-known epoxy resins having at least two epoxy groups per molecule. Exemplary are bisphenol type epoxy resins such as bisphenol A and bisphenol F type epoxy resins, novolak type epoxy resins such as phenol novolak and cresol novolak type epoxy resins, cyclopentadiene epoxy resins, triphenol alkane epoxy resins such as triphenol methane epoxy resins and triphenol propane epoxy resins, biphenyl epoxy resins, naphthalene ring-containing epoxy resins, phenol aralkyl epoxy resins, and biphenyl aralkyl epoxy resins. Also useful are epoxy resins of the following structural formulae.

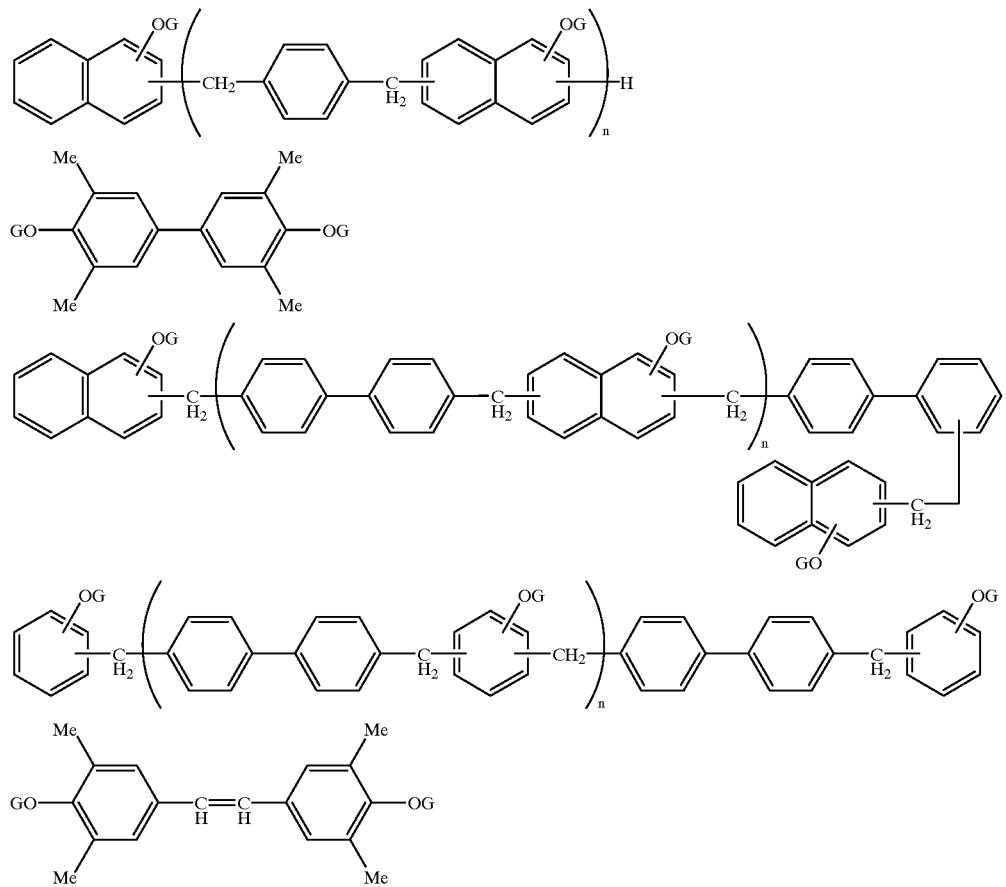

Note: G is glycidyl, Me is methyl, and n is an integer of 0 to 10, preferably 0 to 3.

The epoxy resins should desirably have a total chlorine content of up to about 1,500 ppm, more desirably up to about 1,000 ppm. When chlorine is extracted from the epoxy resin with water at 120° C. and an epoxy resin concentration of 50% by weight over a period of 20 hours, the water-extracted chlorine content is preferably up to about 5 ppm. A total chlorine content in excess of about 1,500 ppm or a water-extracted chlorine content of more than about 5 ppm can be detrimental to the moisture-resistant reliability of semiconductors.

The curing agent (b) of the resin composition according to the invention is usually selected from among conventional curing agents known to cause epoxy resins to cure, such as acid anhydrides, amine compounds, and phenolic resins. From the reliability standpoint, phenolic resins are desirable. Any of phenolic resins having at least two phenolic hydroxyl groups in a molecule may be used. Exemplary phenolic resins include bisphenol resins such as bisphenol A resins and bisphenol F resins, novolak resins such as phenol novolak resins and cresol novolak resins, phenol aralkyl resins, naphthalene ring-containing phenolic resins, cyclopentadiene phenolic resins, triphenol alkane resins such as triphenol methane resins and triphenol propane resins, biphenyl resins, and biphenyl aralkyl resins as well as phenolic hydroxy group-bearing resins of the following structures.

phenolic resins are available per mol of epoxy groups in the epoxy resins. Less than 0.5 mol of phenolic hydroxyl groups on this basis would allow homo-polymerization of more epoxy groups due to shortage of hydroxyl groups, leading to a lower glass transition temperature. On the other than, a mixing ratio in excess of 1.6 mol of phenolic hydroxyl groups would result in a lower crosslinking density and lower strength due to lower reactivity.

In the practice of the invention, phosphorus compounds, imidazole derivatives and cycloamidine derivatives may be used as a curing promoter. The curing promoter is blended in an amount of 0 to about 10 parts, preferably about 0.01 to 10 parts by weight per 100 parts by weight of the epoxy resin and the phenolic resin combined.

Component (c) is an inorganic filler having a maximum particle size of up to 24 μm. Useful fillers include fused silica ground in ball mills, spherical silica prepared by flame fusion, spherical silica prepared by the sol-gel process, crystalline silica, alumina, boron nitride, aluminum nitride, silicon nitride, magnesia, and magnesium silicate. For semiconductor chips which will generate substantial heat, it is desired to use fillers having a greater heat conductivity and a lower coefficient of expansion such as alumina, boron nitride, aluminum nitride and silicon nitride. They may also be blended with fused silica. Of these fillers, spherical inorganic fillers, typically fused silica, are often used, and alumina and aluminum nitride are preferred when heat conductivity is required.

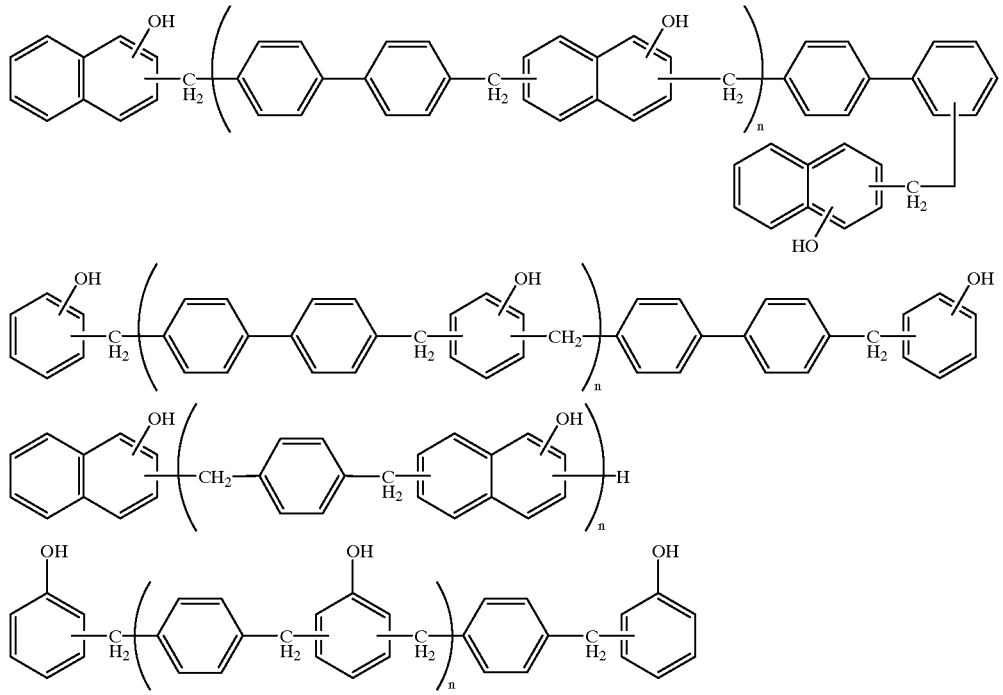

Letter n is an integer of 0 to 10, preferably 0 to 3.

Like the epoxy resins, when these phenolic resins are extracted with water at 120° C., the concentrations of extracted ions such as chloride ions and sodium ions are preferably each up to about 10 ppm, and more preferably up to about 5 ppm.

The mixing ratio of the epoxy resin and the phenolic resin is preferably such that about 0.5 to 1.6 mol, more preferably about 0.6 to 1.4 mol of phenolic hydroxyl groups in the In one example of using fused silica or alumina as the inorganic filler, the amount of fused silica or alumina used is preferably 100 to 550 parts, more preferably 200 to 450 parts by weight per 100 parts by weight of the epoxy resin and the curing agent combined. Less than 100 parts of fused silica or alumina would be too small to fully reduce the coefficient of expansion whereas compositions containing more than 550 parts of fused silica or alumina would become too viscous to mold.

Desirably, the inorganic filler used herein, typically fused silica or alumina, has such a particle size distribution that the mean particle size is from 1 to 15 μm, more desirably 2 to 10 μm, fine particles having a particle size of up to 5 μm account for 20 to 60% by weight of the entire filler, the maximum particle size is up to 24 μm, more desirably up to 20 μm, most desirably up to 10 μm, and the specific surface area (BET adsorption method) is 3.5 to 6.0 m$^2$/g, more desirably 4.0 to 5.0 m$^2$/g. If fine particles having a particle size of up to 5 μm constitute less than 20% by weight of the entire filler, the space between the semiconductor chip and the substrate would not be fully filled, giving rise to the problems of voids and solder bump failure. If fine particles having a particle size of up to 5 μm constitute more than 60% by weight of the entire filler, which means a greater proportion of fines, the wetting of the filler surface with the resin becomes insufficient and the composition becomes increased in viscosity, which requires to increase the molding pressure, sometimes causing solder bump failure. More desirable results are obtained when fine particles having a particle size of up to 5 μm account for 30 to 50% by weight of the entire filler. In general, filling problems are avoided when the maximum particle size of the filler is up to ⅕, preferably up to ⅒ of the distance between the substrate and the semiconductor chip. The mean particle size can be determined as a weight average value (or median diameter) by means of a particle size distribution meter of the laser light diffraction system, for example.

In the practice of the invention, an auxiliary silica filler ranging from a silica filler having a particle size of 3 μm to ultra-microparticulate silica (particle size of up to 0.05 μm, preferably 0.001 to 0.05 μm) may be added to the above-described filler for assisting in closest packing of the filler and imparting thixotropy. For instance, there may be used a mixture of ultra-microparticulate silica having a specific surface area of 50 to 300 m$^2$/g or a particle size of 0.001 to 0.05 μm as typified by aerosil, a fine silica filler having a particle size of 0.05 to 0.5 μm, and a silica filler having a particle size of 0.5 to 3 μm in a suitable proportion. Favorable mixtures consist of 0 to 5% by weight of ultra-microparticulate silica, 1 to 15% by weight of silica having a particle size of 0.05 to 0.5 μm, and 5 to 20% by weight of silica having a particle size of 0.5 to 3 μm, based on the weight of the entire filler. The mixture may be prepared and blended so that it has a mean particle size of 1 μm or less.

In the composition according to the invention, the inorganic filler is contained in an amount of 50 to 85%, especially 70 to 82% by weight based on the entire composition. Compositions with a filler content of less than 50% by weight have a low viscosity, but a high coefficient of expansion so that the encapsulant may peel from the semiconductor chip surface in a thermal cycling test. Compositions with a filler content of more than 85% by weight have a too high viscosity and become less effective in filling capability, causing short-filling defects.

If desired, the epoxy resin composition according to the invention may contain a well-known stress-reducing agent. Such stress-reducing agents include silicone rubber powder, silicone gel powder, silicone-modified epoxy resins, silicone-modified phenolic resins, and thermoplastic resins of methyl methacrylate/butadiene/styrene and derivatives thereof including their hydrogenated products.

For the purpose of reducing the viscosity of the epoxy resin composition, any of well-known diluents may be added. Such diluents include n-butylglycidyl ether, phenylglycidyl ether, styrene oxide, t-butylphenylglycidyl ether, dicyclopentadiene diepoxide, phenol, cresol, and t-butylphenol.

Other additives which can be added to the epoxy resin composition of the invention include flame retardants such as brominated epoxy resins and antimony trioxide; coupling agents such as silane coupling agents, titanium coupling agents, and aluminum coupling agents; coloring agents such as carbon black; wetting modifiers and antifoaming agents such as nonionic surfactants, fluorochemical surfactants, and silicone oil.

The composition of the invention can be prepared by uniformly mixing the above-mentioned essential and optional components in a high-speed mixer or the like and then thoroughly milling in a twin-roll mill or continuous kneader.

There has been described a method for fabricating a semiconductor device by encapsulating an assembly of a semiconductor chip and a circuit substrate with a specific epoxy resin composition. The method ensures that the space between the substrate and the semiconductor chip is filled with the resin encapsulant without leaving voids and without damaging solder bumps. Simple and effective encapsulation is completed within a short time. The resulting semiconductor device has improved moisture resistance and reliability.

EXAMPLE

Examples of the invention are given below by way of illustration and not by way of limitation. All parts are by weight.

Examples 1–3 & Comparative Examples 1–2

Each resin composition was prepared by mixing the ingredients shown in Table 1 in the proportion shown in Table 1. The ingredients were mixed in a high-speed mixture for 10 minutes, milled in a continuous kneader at 50 to 100° C., and sheeted. The sheet was cooled, ground, and compacted into cylindrical tablets.

TABLE 1

| Ingredients (pbw) | E1 | E2 | E3 | CE1 | CE2 |
| --- | --- | --- | --- | --- | --- |
| Epoxy resin (1) | 56.8 | — | — | 56.8 | 56.8 |
| Epoxy resin (2) | — | 61 | — | — | — |
| Epoxy resin (3) | — | — | 48 | — | — |
| Phenolic resin (1) | 37.2 | 34 | — | 37.2 | 37.2 |
| Phenolic resin (2) | — | — | 47 | — | — |
| Brominated epoxy resin | 6 | 5 | 5 | 5 | 5 |
| Spherical silica (1) | — | 250 | — | — | — |
| Spherical silica (2) | 250 | — | — | 550 | — |
| Spherical silica (3) | — | — | — | — | 250 |
| Spherical alumina | — | — | 440 | — | — |

TABLE 1-continued

| Ingredients (pbw) | E1 | E2 | E3 | CE1 | CE2 |
|---|---|---|---|---|---|
| Catalyst (1) | 0.9 | — | 0.9 | 0.9 | 0.9 |
| Catalyst (2) | — | 1.5 | — | — | — |
| Carbon black | 1.0 | 1.0 | 1.0 | 1.0 | 1.0 |
| Coupling agent | 1.1 | 1.1 | 1.1 | 1.1 | 1.1 |
| Filler content (wt %) | 70.8 | 70.7 | 81.0 | 84.4 | 71.0 |

Epoxy resin (1): epoxy equivalent 165

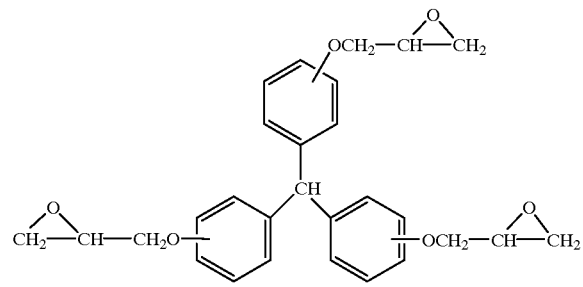

Epoxy resin (2): epoxy equivalent 210

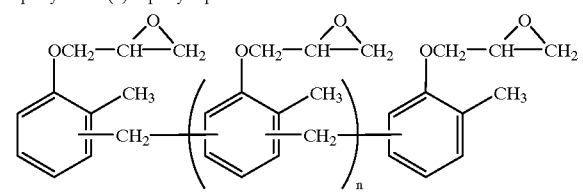

n is a number to give an epoxy equivalent of 210.
Epoxy resin (3): epoxy equivalent 195

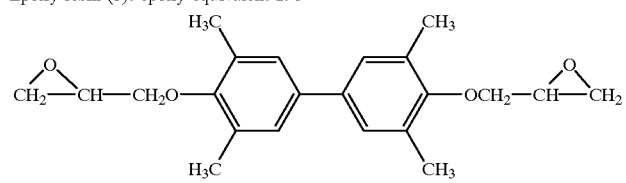

Phenolic resin (1): novolak type phenolic resin, hydroxyl equivalent 110
Phenolic resin (2): phenol aralkyl resin MEH7800 (Meiwa Chemicals K.K.), hydroxyl equivalent 175
Brominated epoxy resin: BREN-S (Nippon Kayaku K.K.), epoxy equivalent 280
Inorganic fillers:
The mean particle size and the maximum particle size were measured by using a laser diffraction type particle size distribution measuring apparatus: Granurometer 920 manufactured by CILAS ALCATEL CO., LTD. in France.

The mean particle size and the maximum particle size were measured by using a laser diffraction type paritcle size distribution measuring apparatus: Granurometer 920 manufactured by CILAS ALCATEL CO., LTD. in France.

|  | Mean particle size ($\mu$m) | Maximum particle size ($\mu$m) |
|---|---|---|
| Spherical silica (1) | 3 | 10 |
| Spherical silica (2) | 5 | 20 |
| Spherical silica (3) | 5 | 48 |
| Spherical alumina | 3 | 15 |

Catalyst (1): triphenylphosphine
Catalyst (2): TPP-K (tetraphenylphosphonium tetraphenylborate)
Coupling agent: γ-glycidoxypropyltrimethoxysilane These epoxy resin compositions were examined by the following tests. The results are shown in Table 2.
(1) Spiral Flow Spiral flow was measured by transfer molding a composition at a temperature of 175° C. and a pressure of 70 kgf/cm$^2$.

(2) Gel Time

The time passed until a composition gelled on a hot plate at 175° C. or 160° C. was measured.

(3) Melt Viscosity

The melt viscosity was measured at a temperature of 175° C. under a load of 10 kg using a constant-load, orifice-type flow testing apparatus of the kind known in Japan as a Koka-type flow tester (Shimazu Mfg. K.K.) equipped with a nozzle having a diameter of 1 mm.

(4) Glass Transition Temperature (Tg) and Linear Expansion Coefficient ($\alpha$):

Test specimens with dimensions of 4×4×15 mm were obtained by molding each composition at 175° C. and 70 kgf/cm$^2$ for a time of 2 minutes and post-curing at 180° C. for 4 hours. Measurement of both properties was carried out by raising the temperature of the test specimen at a rate of 5° C./min in a dilatometer.

TABLE 2

|  | E1 | E2 | E3 | CE1 | CE2 |
|---|---|---|---|---|---|
| Spiral flow, cm | 183 | 195 | 210 | 76 | 176 |
| Gel time, sec. @ 175° C. | 19 | 20 | 21 | 18 | 19 |
| Gel time, sec. @ 160° C. | 45 | 52 | 53 | 42 | 45 |
| Melt viscosity, poise | 48 | 40 | 38 | 250 | 54 |
| Tg, ° C. | 170 | 157 | 125 | 172 | 168 |
| α (below Tg) | 20 | 19 | 20 | 12 | 20 |

Next, an assembly of a BT substrate of 0.28 mm thick and a semiconductor chip of 10 mm×10 mm×0.25 mm (thick) joined through 450 solder bumps having a diameter of 75 μm was set in a mold heated at 160° C. as shown in FIG. 3. The resin composition in cylindrical tablet form was preheated at 65° C. by a high-frequency preheater, admitted into a plunger pot, and injected into the cavity under a molding pressure of 40 kgf/cm² for 20 seconds. After the injection, the composition was cured for 60 seconds. The mold was opened and the semiconductor device was taken out. Using an ultrasonic flaw detector, the semiconductor device was inspected whether the space was fully filled with the resin composition, whether or not voids were present, and whether solder bumps failed. The results are shown in Table 3.

TABLE 3

|  | E1 | E2 | E3 | CE1 | CE2 |
|---|---|---|---|---|---|
| Space fill | OK | OK | OK | short fill | short fill |
| Voids | none | none | none | found | found |
| Solder bumps | OK | OK | OK | some failed | some failed |

For the comparison of moisture resistance, a semiconductor device assembly as used above was encapsulated using a conventional flip-chip underfill material (epoxy resin composition) of the acid anhydride curing type (Comparative Example 3). The flip-chip underfill material of the acid anhydride curing type was of the following composition.

|  | Parts by weight |
|---|---|
| Bisphenol A type epoxy resin | 50 |
| 4-methylhexahydrophthalic anhydride | 30 |
| Spherical silica (mean particle size 5 μm, maximum particle size 15 μm) | 100 |
| 2-phenylimidazole | 0.2 |

Five samples for each of the semiconductor device encapsulated in Example 1 and the semiconductor device encapsulated in Comparative Example 3 were placed in a pressure cooker at 121° C. and 2.1 atmospheres. The samples were taken out at predetermined time intervals, and the separation between the chip surface and the resin was observed by an ultrasonic flaw detector. The results are shown in Table 4.

TABLE 4

|  | Number of defective samples/total | | | |
|---|---|---|---|---|
| Time | 48 hr. | 96 hr. | 196 hr. | 392 hr. |
| Example 1 | 0/5 | 0/5 | 0/5 | 0/5 |
| Comparative Example 3 | 0/5 | 0/5 | 1/5 | 3/5 |

Japanese Patent Application No. 035453/1998 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A method for fabricating a semiconductor device, comprising the steps of:

placing a semiconductor chip having contacts over a circuit substrate having interconnecting electrodes such that the semiconductor chip contacts abut against the substrate electrodes via solder bumps, heating and fusing the solder bumps to join the semiconductor chip to the substrate, placing the substrate having the semiconductor chip mounted thereon in a cavity of a mold, feeding an encapsulated resin composition in molten state and under a pressure of 10 to 100 kgf/cm² into the mold cavity through a gate for forcibly filling a space between said substrate and said semiconductor chip with the resin composition, and curing the resin composition for encapsulating the space with the resin composition, said encapsulating resin composition comprising (a) an epoxy resin, (b) a phenolic resin curing agent, and (c) 50 to 85% by weight based on the entire composition of a particulate inorganic filler having a maximum particle size of up to 24 μm as essential components, said composition having a melt viscosity of up to 200 poises at the molding temperature.

2. The method of claim 1, wherein the particulate inorganic filler contains fine particles having a particulate size of up to 5 μm in an amount of 20 to 60% by weight of the entire filler, and has a specific surface area of 3.5 to 6.0 m²/g.

3. The method of claim 2, wherein the maximum particle size of the particulate inorganic filler is up to ⅕ of the distance between the substrate and the semiconductor chip.

4. The method of claim 1, wherein the particulate inorganic filler contains 0 to 5% by weight of ultra-microparticulate silica having a particle size of up to 0.05 μm, 1 to 15% by weight of silica having a particle size of 0.05 to 0.5 μm and 5 to 20% by weight of silica having a particle size of 0.5 to 3 μm, based on the weight of the entire filler.

5. The method of claim 1, wherein the mold is heated at about 130 to about 200° C.

6. The method of claim 1, wherein the distance between the semiconductor chip and the substrate is about 10 μm to about 150 μm.

7. The method of claim 6, wherein the distance between the semiconductor chip and the substrate is about 20 μm to about 100 μm.

8. The method of claim 1, wherein the distance between the semiconductor chip and the substrate is about 30 μm or more.

9. The method of claim 1, wherein the encapsulated resin composition is fed into the mold cavity under a pressure of about 30 to about 50 kgf/cm².

10. The method of claim 1, wherein said resin composition has a melt viscosity of up to 50 poises at 175° C.

* * * * *